United States Patent [19]
Rohrbaugh et al.

[11] Patent Number: 6,067,651
[45] Date of Patent: May 23, 2000

[54] TEST PATTERN GENERATOR HAVING IMPROVED TEST SEQUENCE COMPACTION

[75] Inventors: John G. Rohrbaugh; Jeffrey R. Rearick, both of Ft. Collins, Colo.

[73] Assignee: Hewlett-Packard Company, Palo Alto, Calif.

[21] Appl. No.: 09/027,106

[22] Filed: Feb. 20, 1998

[51] Int. Cl.[7] .................................................. G01R 31/28
[52] U.S. Cl. ........................... 714/738; 714/726; 714/727
[58] Field of Search ............................ 707/101; 714/727, 714/720, 726, 744, 738, 742

[56] References Cited

U.S. PATENT DOCUMENTS

| | | | |
|---|---|---|---|
| 4,991,176 | 2/1991 | Dahbura et al. | 714/738 |
| 5,418,793 | 5/1995 | Chang et al. | 714/738 |
| 5,444,717 | 8/1995 | Rotker et al. | 714/744 |
| 5,485,613 | 1/1996 | Engelstad et al. | 395/650 |
| 5,499,248 | 3/1996 | Behrens et al. | 714/724 |
| 5,517,506 | 5/1996 | Underwood et al. | 714/744 |
| 5,617,427 | 4/1997 | Ohta et al. | 714/729 |
| 5,696,772 | 12/1997 | Lesmeister | 714/32 |
| 5,726,996 | 3/1998 | Chakradhar et al. | 714/724 |
| 5,864,838 | 1/1999 | Rusterholz | 707/101 |
| 5,905,986 | 5/1999 | Rohrbaugh et al. | 707/101 |

OTHER PUBLICATIONS

Aourid, et al., Neural Networks for the Set Covering Problem: An Application to the Test Vector Compaction, IEEE, 1994.

Cheng, Partial Scan Designs without Using a Separate Scan Clock, IEEE, 1995.

Lambert, et al., Methods for Dynamic Test Vector Compaction in Sequential Test Generation, IEEE, 1995.

Ayari, et al., A New Dynamic Test Vector Compaction for Automation Test Pattern Generation, IEEE, 1994.

Radtke, et al., Distributed Automatic Test Pattern Generation with a Parallel FAN Algorithm, IEEE, 1995.

Collective Test Generation and Test Set Compaction, Wang, et al., IEEE Feb. 1995.

Bottom–Up Testing Methodology for VLSI, Teixeira, et al., IEEE, Jan .1988.

(List continued on next page.)

*Primary Examiner*—Albert De Cady
*Assistant Examiner*—Guy Lamarre

[57] ABSTRACT

A method is provided for generating a compacted set of test sequences for use by a tester that tests an integrated circuit having a scan register containing a plurality of bits that define test inputs for the integrated circuit. In accordance with the preferred embodiment, the method begins by defining a list of faults for the integrated circuit and generates a first test sequence that defines values for those inputs necessary (preferably only those inputs necessary) to detect a target fault selected from the list of faults. The method then adds the first test sequence to a list of test sequences and marks the selected fault as detected. The method then generates an additional test sequence that defines values for those inputs necessary (preferably only those inputs necessary) to detect a target fault selected from the list of faults, a fault other than one previously marked as detected. Finally, the preferred method determines whether the additional test sequence may be compacted with any test sequence in the list of test sequences, and if so, compacts the additional test sequence with a test sequence in the set of test sequences. If the additional test sequence may not be compacted with any test sequence in the list of test sequences, the method adds the additional test sequence to the set of test sequences. The process of generating additional test sequences and compacting them, when possible, to sequences in the set of sequences is repeated until a compacted condition is reached.

31 Claims, 11 Drawing Sheets

OTHER PUBLICATIONS

Introduction to Switching Theory and Logical Design, 3d Edition, Hill, et al., pp. 141, 142, 158, 415, 416, 1981.

Short Papers, article "Test Compaction For Sequential Circuits", by Thomas M. Niermann, Rabindra K. Roy, Janak H. Patel, and Jacob A. Abraham, published in IEEE Transactions On Computer–Aided Design, vol. 11, No. 2, Feb. 1992, pp. 260–267.

Article "Putting The Squeeze On Test Sequences" by Elizabeth M. Rudnick and Janak H. Patel, Center for Reliable & High–Performance Computing, University of Illinois, Urbana, IL, published in 1997 IEEE, International Test Conference, Pager 30.1, pp. 723–732.

Article "Test Generation & Dynamic Compaction of Tests", by Prabhakar Goel & Barry C. Rosales, IBM Corporation, published in 1979 IEEE, 1979 IEEE Test Conference, Cherry Hill, New Jersey, Session 9, pp. 189–192.

Article "Compactest: A Method To Generate Compact Test Sets For Combinational Circuits" by Irith Pomeranz, Lakshmi N. Reddy + and Sudhakar M. Reddy +, Electrical and Computer Engineering Department, University of Iowa City, IA 52242, published in 1991 IEEE, International Test Conference 1991, Paper 7.2, pp. 194–203.

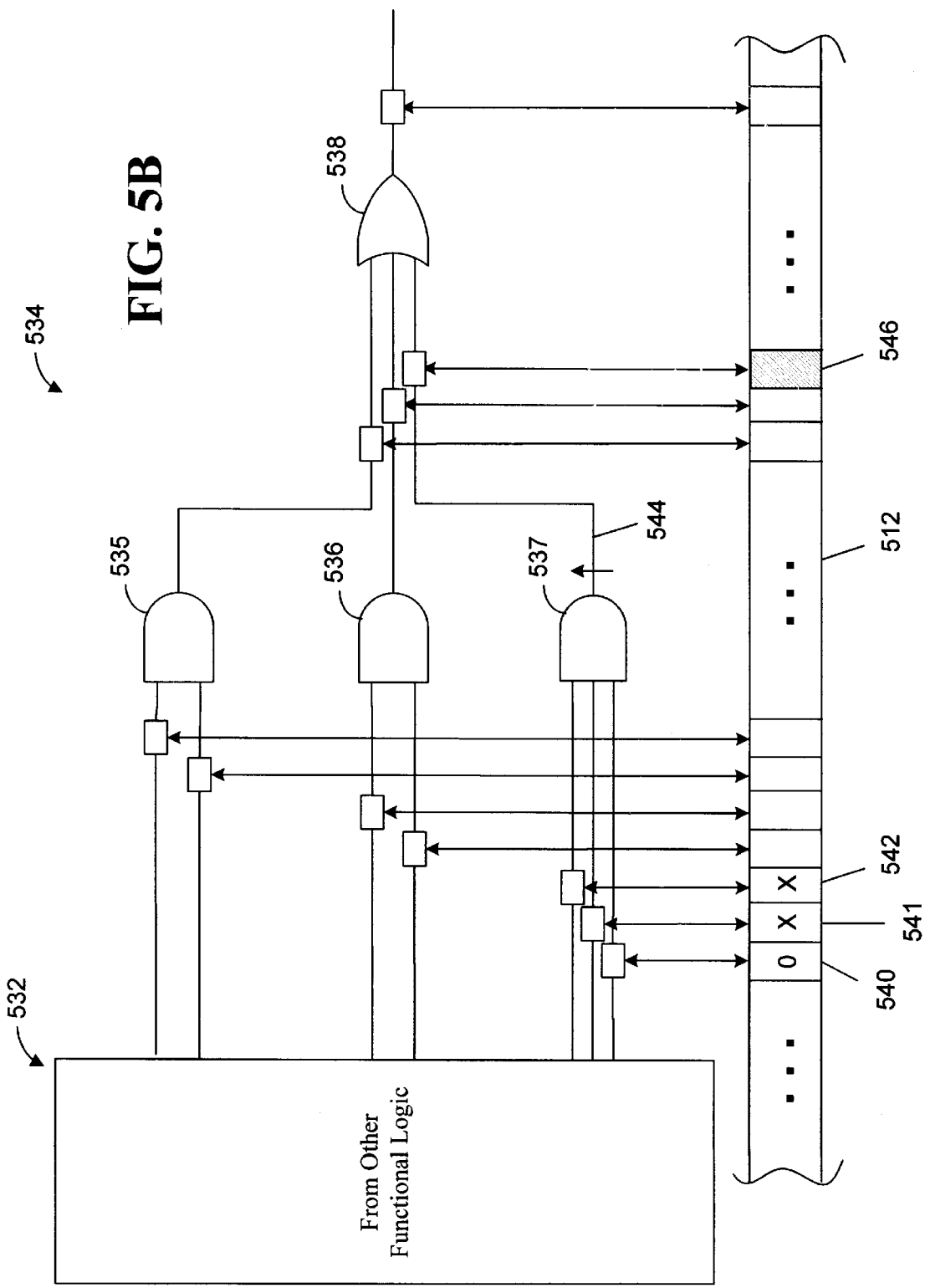

```
X  1  0  1  X  X  X  X  X  1  X  X  X  ← Vector 1
X  X  X  1  0  0  X  X  X  X  X  X  X  ← Vector 2
-------------------------------------------
X  1  0  1  0  0  X  X  X  1  X  X  X  ← Compacted Set
```

FIG. 6A

```
X  1  0  1  0  0  X  X  X  1  X  X  X  ← Old Compacted Set
X  0  0  X  X  X  1  X  0  1  X  X  X  ← Additional Vector
-------------------------------------------
[X  1  0  1  0  0  X  X  X  1  X  X  X]
[X  0  0  X  X  X  1  X  0  1  X  X  X] ← New Compacted Set
```

FIG. 6B

```
[X  1  0  1  0  0  X  X  X  1  X  X  X]
[X  0  0  X  X  X  1  X  0  1  X  X  X] ← Old Compacted Set 0  1  0  X  X  X  X  X  X  X  X  X  X  ← Additional Vector
-------------------------------------------
[0  1  0  1  0  0  X  X  X  1  X  X  X]
[X  0  0  X  X  X  1  X  0  1  X  X  X] ← New Compacted Set
```
610

FIG. 6C

TEST PATTERN GENERATOR HAVING IMPROVED TEST SEQUENCE COMPACTION

BACKGROUND OF THE INVENTION

1. Field of the Invention

The present invention generally relates to testing devices, and more particularly to an improved test pattern generator for compacting test sequences in an automatic test pattern generator.

2. Discussion of the Related Art

A variety of automatic test equipment (ATE) have long been known for testing electronic circuits, devices, and other semiconductor and electronic products. Generally, automatic test equipment are divided into two broad categories, analog testers and digital testers. As the names imply, analog testers are generally designed for testing analog circuit devices, while digital testers are designed for testing digital circuit devices. Digital testers, as is known, generally include a testing device having a number of internal circuit cards or channels that generate programmably controlled test signals for testing and evaluating a Device Under Test (DUT). More specifically, ATE are programmably controlled to be adapted or configured to testing a variety of devices in a variety of ways. This is achieved by programming ATE inputs to inject a certain signal (or signal transition) and by programming ATE outputs to compare a value to a certain pin or signal line on a DUT. In this regard, a digital tester generally includes a test head whereby electrical signals are input to and output from the tester. The test head comprises a number of connectors, each defining a channel, which may be connected via cable or otherwise to a device under test. The electronics within the digital tester may then input and output signals to/from a DUT via the test head.

By way of an extremely simple illustration, consider a digital tester that is configured to test a package containing, among other things, a two input AND gate. The digital tester may be configured to apply a logic one on the two signal lines that correspond to the inputs of the AND gate, then receive the signal on the signal line corresponding to the output to ensure that it is driven to a logic one in response. The tester may then be configured to alternatively apply logic zero signals on each of the two signal lines corresponding to the AND gate inputs, in order to verify that the output of the AND gate transitions from a logic one to a logic zero in response. If proper (i.e., expected) operation is not realized then a defect is detected.

An integrated circuit tester includes a set of modules or "nodes", wherein one node is associated with each terminal of the DUT. When the DUT is an integrated circuit chip (IC) chip, then one node is associated with each pin of the IC chip. A test is organized into a set of successive time segments ("test cycles"). During any given test cycle, each node can either transmit a test signal to the pin, sample a DUT output signal at the associated pin, or do neither. Each node includes its own memory for storing a sequence of these transmit or sample commands ("test vectors").

As is known by those skilled in the art, a test generator is independent and distinct from a tester. A test generator uses a model of a device to formulate a set of test vectors that will efficiently test for and detect faults on the tested device. Whereas, a tester is a device disposed downstream of the test generator. It utilizes the set of test vectors generated by the test generator in order to test the actual device.

A test vector or test pattern, as generated by a test generator, is a string of n logic values (0, 1, or don't care—X) that are applied to the n corresponding primary inputs (PIs) of a circuit at the same time frame. A test sequence is a series of test vectors applied to a sequential circuit in a specific order to detect a target fault. The first vector in the test sequence assumes the circuit to be in a completely unknown state. A test set is an unordered set of test sequences. For combinational circuits with combinational faults, there is no need for test sequences and the test set consists of an unordered set of test vectors. Test length refers to the number of test vectors in a test set.

In order to reduce the length of a test set, the test set is compacted. Traditionally, test set compaction was performed statically. Static compaction is the process of reducing the depth of a test set, after all test vectors have been generated. A circuit to be tested may be modeled, and a fault list for that circuit generated. A "fault" is simply a location where a defect might be manifested. Thus, a fault list, is a listing of many (possibly all) locations where faults may occur. A test vector for each fault from the fault list may be generated to test the given fault. In this way, a single test vector is created to test a given circuit fault.

In early systems, a test set of single-fault test vectors was compacted statically. In this regard, a test vector was created for each and every fault on the fault list. After the entire test set was composed, the depth of the test set was reduced by algorithmic operation. Although the specific algorithm may vary from system to system, the general operation was the same. For example, one known algorithm operated by evaluating the first test vector, and determining whether the second test vector could be compacted with it (the first vector). Then the next test vector was analyzed to determine whether it could be compacted with the first vector, and so on down the vectors of the test set, until the end of the set was reached. Then, the process was repeated for the second test vector. Once a subsequent vector was added to (compacted with) a prior test vector, then the latter test vector was deleted from the test set, thereby reducing its depth by one. This process was completed until a fully compacted test set was obtained.

A paper by Prabhakar Goel and Barry C. Rosales (of IBM Corporation), entitled Test Generation & Dynamic Compaction of Tests, and published in the 1979 IEEE Test Conference (hereafter referred to as "the Goel Paper"), described the advantage of dynamic compaction over static compaction, and is hereby incorporated by reference. In short, static compaction is characterized as a "postprocessing" operation, whereby a set of test vectors are first generated. Each test vector in the list is uniquely defined to test for a given fault in a DUT. Once the set of test vectors is generated, it is processed (ergo postprocessing) to reduce the number of vectors in the set through compaction techniques.

In contrast, dynamic compaction operates to generate compacted vectors one at a time. More specifically, a first test vector is generated to test for a given fault in a list of faults to be tested (just like the first test vector generated in static compaction). However, before generating a second test vector, an attempt is made to utilize the first test vector to test for additional faults. In this regard, the unused bit positions (i.e., don't care values) may be set to either "1"s or "0"s, or existing bit positions may be utilized, to the extent that the values need not be changed. Although the term dynamic compaction may be somewhat misleading, in that the process does not actually "compact" two existing test vectors, the net result is much the same.

A fully compacted test vector is one wherein (i) no PI is at X (don't care), or (ii) no new faults may be detected by making any X value a 0 or a 1. Ideally, dynamic compaction operates to generate a fully compacted test vector before proceeding to the generation of the next test vector. However, in practice, this is usually not the result. Instead, most dynamic compaction algorithms generate what may be termed "substantially compacted" test vectors. As is known, the degree to which a test vector may be compacted will necessarily depend upon the model for the DUT, as well as the particular vectors that are necessary to generate the needed fault tests. Further, after a certain level of compaction has been obtained, further compaction is extremely computationally intensive and thus time consuming. Therefore, once a certain level of compaction has been obtained, the vector is often deemed substantially compacted, and no further compaction is attempted. Instead, the don't care bit positions of the substantially compacted vector are random filled (with 1s and 0s) and fault simulated, and a new test vector is generated.

An advantage of dynamic compaction, as is generally recognized, is that it usually results in a smaller set of test vectors than that achieved by static compaction. Reducing the set of the test vectors, correspondingly reduces time required to generate them. However, dynamic compaction is generally recognized as being computationally intensive. Indeed, since the publication of the Goel Paper, it has been generally accepted in the relevant industry that dynamic compaction achieves better results than static compaction, by reducing the total number of tests that need to be applied at a tester to a given DUT. Nevertheless, as integrated circuits continue to grow in size and complexity, even dynamic compaction techniques result in memory shortages and excessive computation problems, and therefore further improvements are desired.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to an improved automatic test pattern generator for generating test patterns that are used by an integrated circuit testing device. In accordance with one aspect of the invention, a method is provided for generating a compacted set of test vectors for testing an integrated circuit having a scan register containing a plurality of bits that define test inputs for the integrated circuit. In accordance with the preferred embodiment, the method begins by defining a list of faults for the integrated circuit and generates a first test sequence that defines values for those inputs necessary (preferably only those inputs necessary) to detect a target fault selected from the list of faults. The method then adds the first test sequence to a list of test sequences and marks the selected fault as detected. The method then generates an additional test sequence that defines values for those inputs necessary (preferably only those inputs necessary) to detect a target fault selected from the list of faults, and one other than one previously marked as detected. Finally, the preferred method determines whether the additional test sequence may be compacted with any test sequence in the list of test sequences, and if so, compacts the additional test sequence with a test sequence in the set of test sequences. If the additional test sequence may not be compacted with any test sequence in the list of test sequences, the method adds the additional test sequence to the set of test sequences. The process of generating additional test sequences and compacting them, when possible, to sequences in the set of sequences is repeated until a compacted condition is reached.

As noted above, the method of the present invention operates to "mark" selected faults from the list of faults as vectors are formulated that detect certain faults. It will be appreciated that the step of "marking selected faults as detected" is to be given a broad interpretation. Since the preferred embodiment is implemented in software, there are a tremendous variety of ways in which such a step may be implemented. What is relevant for purposes of the invention is that the selected faults be distinguished in some fashion from those faults in the list not yet selected or detected by a test vector.

In accordance with a preferred embodiment, a compacted condition is defined by a set of test sequences that test substantially all faults in the list of faults. Preferably, the compacted condition is defined by a set of test sequences that tests all faults in the list of faults. In one embodiment, the method operates to periodically simulate the set of test sequences in order to detect additional faults. Any such additional faults that are detected are marked from the list of faults, so that additional test sequences for those faults need not be generated. As will be appreciated, and consistent with the inventive concepts, each test sequence is a single test vector when fault simulating combinational logic. However, when fault simulating sequential logic, each test sequence defines a plurality of test vectors.

DESCRIPTION OF THE DRAWINGS

The accompanying drawings incorporated in and forming a part of the specification, illustrate several aspects of the present invention, and together with the description serve to explain the principles of the invention. In the drawings:

FIGS. 5A–5C are schematic diagrams illustrating testing procedures for an integrated circuit chip tested in accordance with the present invention;

FIGS. 6A–6D are tables that illustrating a test vector compaction method performed in accordance with the invention;

DETAILED DESCRIPTION OF THE PREFERRED EMBODIMENT

Figure 1:
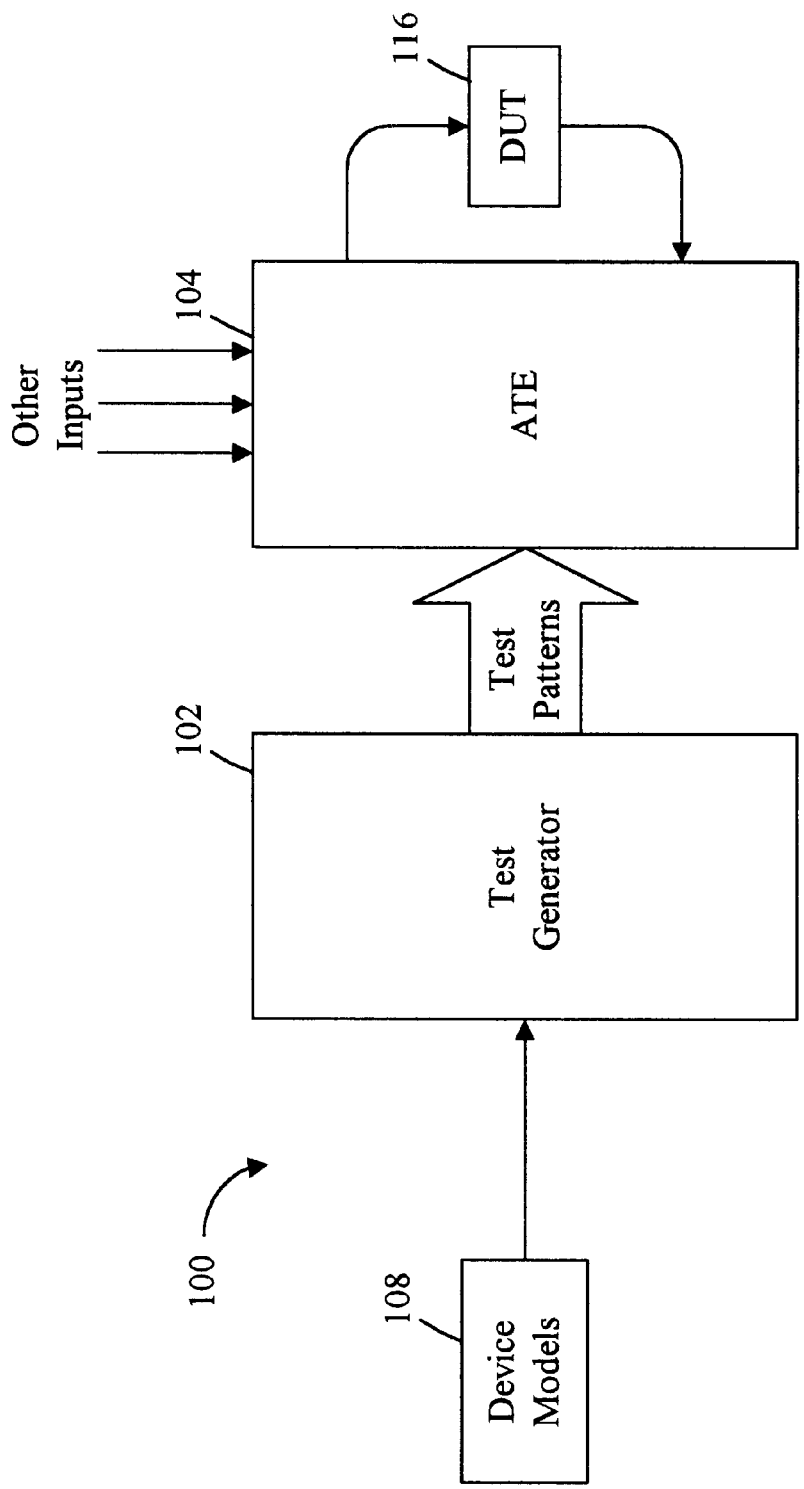
FIG. 1 is a block diagram of an automated testing device for testing digital electronic circuitry.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to FIG. 1, a block diagram of a testing system and process 100 is shown. Although the preferred embodiment of the present invention is directed to an improved test pattern generator 102, FIG. 1 also shows the components of the surrounding environment. The system 100 includes a test generator 102 and an ATE 104. The test generator 102 generates test patterns (in a manner that will be more fully described below) that are communicated to the ATE 104, which may thereafter be used to test a device under test (DUT) 116. In accordance with the preferred embodiment, the DUT 116 is an integrated circuit chip, which is tested by applying input signals to one or more input pins and evaluating output signals delivered to one or more output pins of the DUT 116.

As is known, a comprehensive test plan for the DUT 116 includes a specification of the DUT 116 pins, voltage levels, timing, vectors, and tests. Since the present invention is concerned with the generation of test patterns (vectors), the illustrated embodiment depicts those components relevant to this aspect.

Specifically, a device model 108 contains data for logic and connectivity, and provides the data required for test generator 102 to generate the in-circuit tests. Typically, a device model 108 provides information regarding connectivity and structure of one or more devices. In addition, it specifies implied functions at a low level (such as AND, OR, and NOT, and perhaps other primitives as well).

The test generator 102 uses the data provide from the device model 108 and generates a compacted set of test vectors. Once the compacted set of test vectors is created, it is transferred to the ATE 104, where the compacted set may be used over and over to test DUTs 116.

Figure 2:
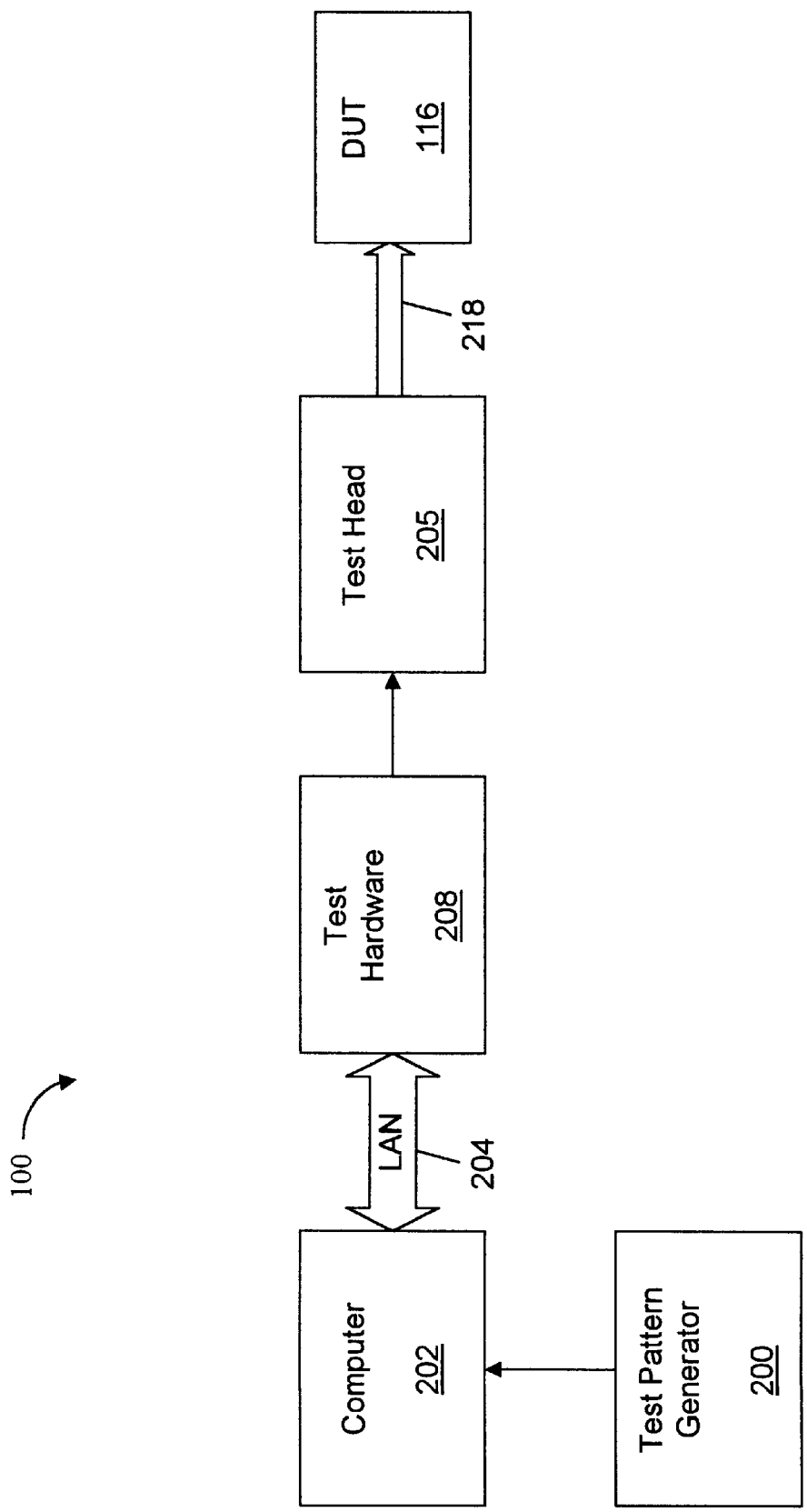
FIG. 2 is a block diagram illustrating an automated testing device.

Reference is now made to FIG. 2, which illustrates an environment in which the tester 100 may operate. A host computer 202 running an application program may be coupled to test hardware 208. In one embodiment, host computer 202 may be coupled to the test hardware 208 via a Local Area Network (LAN) 204. The test hardware 208 typically includes a test head 205 which provides the interface input and output to a DUT 116. The test hardware 208 may include devices, such as drivers and receivers, which can be used to perform testing on the DUT 116. An application program in the host computer 202 may communicate with an interpreter which performs Dynamic Link Library (DLL) calls which instruct remote test head 205 to perform a particular function. The test hardware 208 may receive instructions from the host computer 202. These instructions may then control the various tests that are run on DUT 116.

A test pattern generator 200 constructed in accordance with the present invention, and which will be described in more detail below, provides test pattern data that is input to the computer 202. As will be appreciated, the test pattern generator 200 operates to generate input test patterns before the actual testing execution takes place. Indeed, a compacted set of test patterns may be generated and stored on computer 202 for later test executions.

Figure 3:
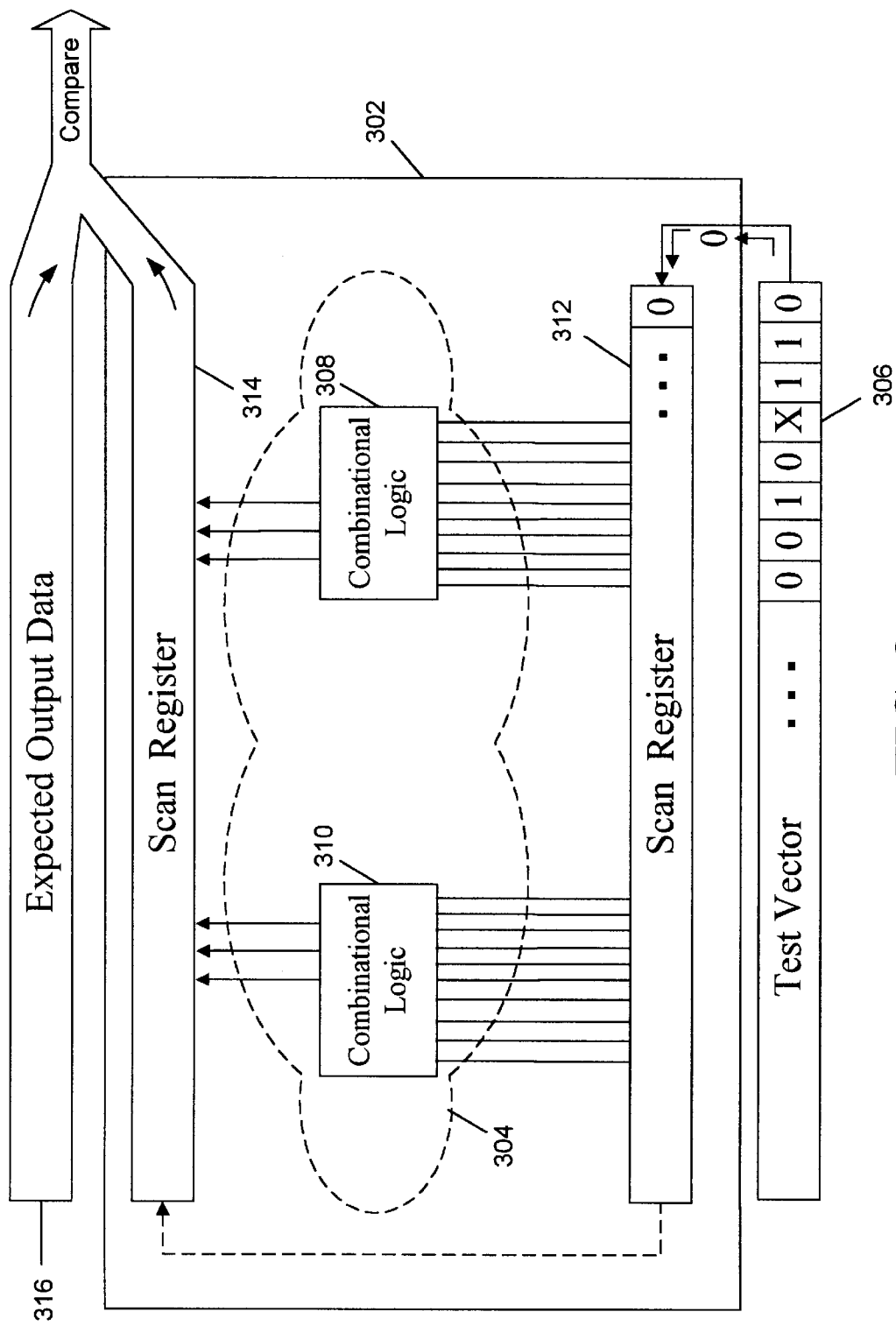
FIG. 3 is a block diagram conceptually illustrating fundamental components of an integrated circuit chip tested in accordance with the present invention.

Referring now to FIG. 3, a block diagram is shown that illustrates a testing environment of the present invention. Specifically, the preferred embodiment of the present invention is directed to a method and apparatus for generating a compacted set of test vectors, and is particularly suited for use in scan-type testing. As is known, broadside testing operates by applying test signals to the input pins of integrated circuit chips, and monitoring the output generated on output pins of that same chip. Due to the density of functional circuitry now provided on integrated circuit chips, scan-type testing is employed. To more specifically describe scan-type testing, if testing hardware has access only to the input and output pins of an integrated circuit chip, then the operation of the vast majority of the circuitry of most integrated circuit chips cannot practically be tested directly. Scan-type testing is achieved by providing specialized circuitry integrated within the integrated circuit chip to be tested that allows test inputs to be propagated into the chip for testing the functional logic thereof, and test outputs to be acquired.

By way of terminology, scan chains or scan registers are utilized in this fashion. For example, and in reference to FIG. 3, an integrated circuit chip 302 includes functional circuitry 304 (which may comprise both sequential and combinational logic) is provided on board the integrated circuit chip 302. A test vector 306 contains a plurality of bits that define the test input and output. As is known, the bits of the test vector 306 are generally set to values of either 1 or 0, but some may be don't care values (e.g., "X"). Often, the test vector 306 is rather lengthy, and may comprise several hundred, or even several thousand, bits. These bit values are then shifted serially into the integrated circuit chip 302 where they may be used to test combinational logic 308 and 310, which may be imbedded deep within the integrated circuit chip 302. In this regard, the bit positions of the test vector 306 are shifted into a scan register 312. The scan register 312 is illustrated in the drawing as a single register. However, and as is known, the register may comprise a plurality of scan chains, which are individual registers or serial bit positions within the chip. Consistent with the terminology used herein, the collection of all the scan chains comprise a scan register. For purposes of simplicity and illustration, only one scan chain has been illustrated in FIG. 3.

In similar fashion, an output scan register 314 may be provided in connection with an output vector register 316. In operation (conceptually), the bits of the test vector 306 are shifted into the scan register 312. The various bit positions of the scan register 312 are input to combinational logic sections 308 and 310 of the integrated circuit 302. Once the entire test vector 306 has been shifted into the scan register 312, the outputs of the combinational logic sections 308 and 310 may be captured by the output scan register 314, then shifted out to an output register 316 where the values are compared against predefined expected data values. This concept is illustrated graphically by the "Compare" arrow.

It should be appreciated that the input scan register 312 and output scan register 314 have been illustrated as such merely to simplify the discussion herein. In practice, each bit position of a scan chain may be both an input and an output. That is, a test vector may be clocked into the chip via an input scan chain. Then, once the entire test vector is clocked into the chip, the functional circuitry to be tested is tested (by the vector), and the scan register may again be clocked to capture output values. At this time, the same scan chain/register may be viewed as an output scan register 314, and its value may be clocked out of the chip, where it is compared against an expected value for that register. Dashed lines coupling the two illustrated registers 312 and 314 depict this concept of register continuity and bi-directionality.

Figure 4:
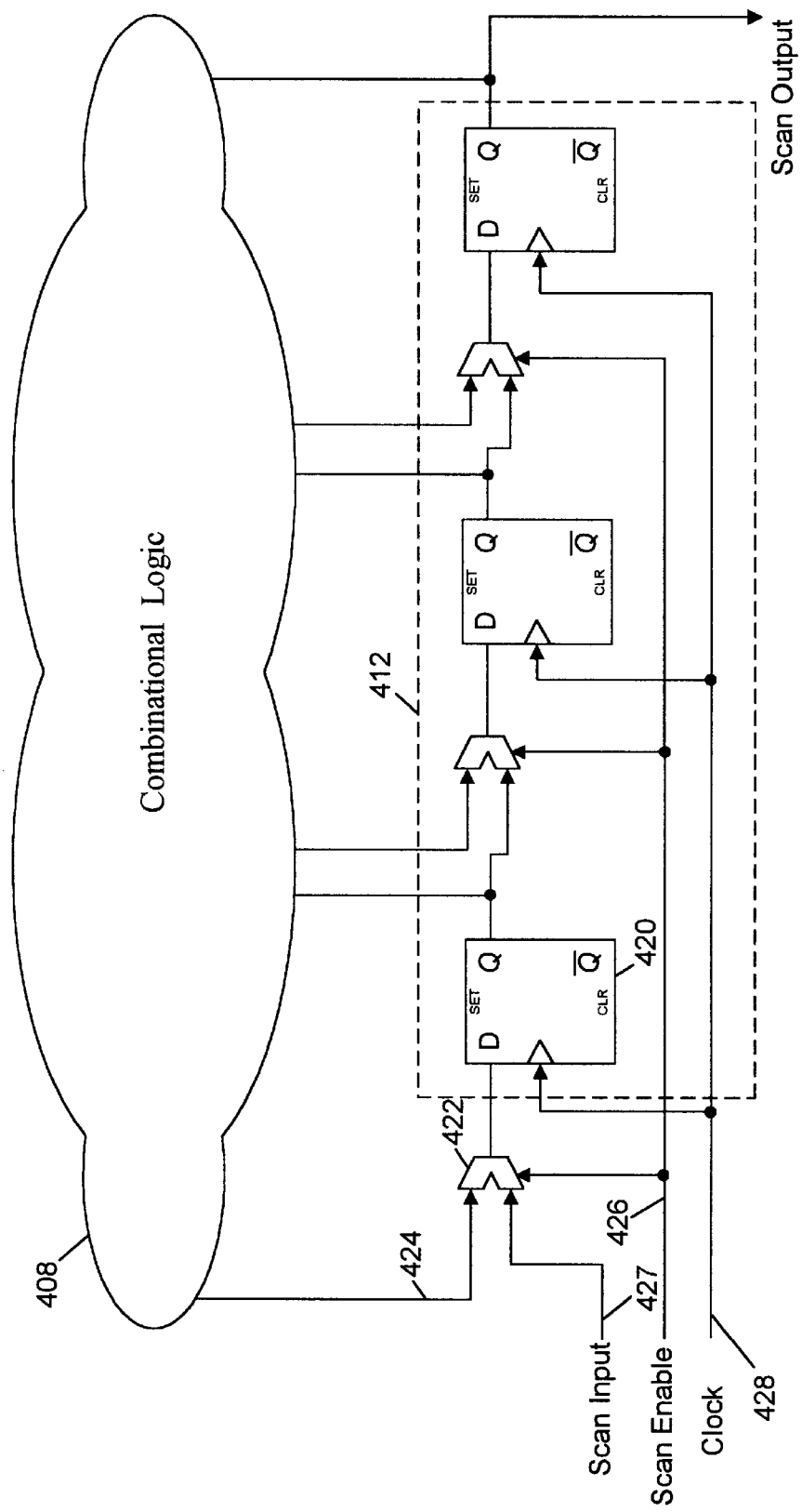
FIG. 4 is a schematic diagram illustrating components of an integrated circuit chip tested in accordance with the present invention.

It will be appreciated that the diagram of FIG. 3 has been presented purely for purposes of illustration and, in light of the discussion that follows in connection with FIGS. 4 and 5, a better understanding of the preferred embodiments will be appreciated. What should be appreciated from FIG. 3, however, is that by utilizing scan chains (or a scan register) bits of a test vector may be propagated into and out of an integrated circuit chip 302 to allow direct testing of functional logic that may be buried deep within the integrated circuit chip 302, and thus not directly accessible or testable by the pins of the integrated circuit chip 302.

Reference is now made to FIG. 4, which illustrates a more practical implementation of the scan chains and scan register of the preferred embodiment. In this regard, instead of providing a separate register to comprise the scan register 312, typically sequential logic already embedded within the circuit chip is utilized. For example, and again for purposes of illustration, assume flip flops (e.g., 420) are provided in a integrated circuit chip, and are functionally configured to operate in a certain manner. Test vector values may be shifted into these registers via, for example, multiplexers 422. In this regard, a multiplexer 422 may have 2 inputs: one for receiving an input from the functional logic 424 provided on the chip, and one for receiving input values from a scan input 427 provided in connection with the testing configuration of the chip. A scan enable line 426 may be provided as a multiplexer select, to select which of the two inputs is routed through the multiplexer 422 to the flip flop 420. Once the various bit values of the test vector 306 have been shifted into the scan chain 412, the scan enable line 426 may be set to propagate the appropriate bit values of the scan chain 412 to the various sequential circuit devices (e.g., 420). As will be understood, a clock line (denoted as scan clock) 428 may be toggled to clock in the various bit values through the respective sequential circuit components comprising the scan chain (or scan register) 412. In this way, the various outputs of the sequential circuit components may be controllably set in order to test the combinational logic 408 of the integrated circuit chip. In this regard, it is assumed that the functional logic of an integrated circuit chip will comprise a combination of sequential and combinational logic, which may be organized in various layers (e.g, a layer of sequential logic, then a layer of combinational logic, then a layer of sequential logic, another layer of combinational logic, etc.). Any given "layer" of combinational logic may be tested by controlling the values directed to the inputs of that combinational logic, in a manner described above and illustrated in connection with FIG. 4, and observing its outputs. The outputs of the combinational logic components may then be directed to one or more output scan chains, which then may be shifted serially out of the integrated circuit chip for evaluation by the testing equipment. In this regard, and as illustrated in FIG. 3, a separate output scan register may be formed within the chip, or alternatively, the output scan chain utilize the same sequential registers as the input scan chain.

By way of clarification, and as will be understood, the broad concepts and teachings of the present invention applies to sequential circuitry as well as combination logic. Specifically, the generation of a compacted set of test vectors applies to both types of circuitry. The preferred embodiment of the invention, as described herein is directed to the generation of a compacted set of test vectors for testing combinational logic. However, the compaction method of the invention, may also be used to compact test vectors for sequential circuit testing as well. To simplify the inventive concepts, however, the invention has been illustrated only with respect to the fault simulation of combinational logic.

In short, the preferred embodiment (combinational logic fault simulation) generates a list of test vectors one by one, and simultaneously compacts that list (one by one). In an alternative embodiment for fault simulating sequential logic, a sequence of test vectors would be generated in place of each test vector of the preferred embodiment. Thus, the invention would operate on a set of test vector sequences, which may be different lengths. The length of a given sequence would depend upon the number of sequential logic layers traversed by the test generator.

The concepts of the present invention may also apply to analog circuitry, in certain situations. For example, when the analog circuitry is configured in a logic-like fashion (e.g., comparators).

Figure 5A:
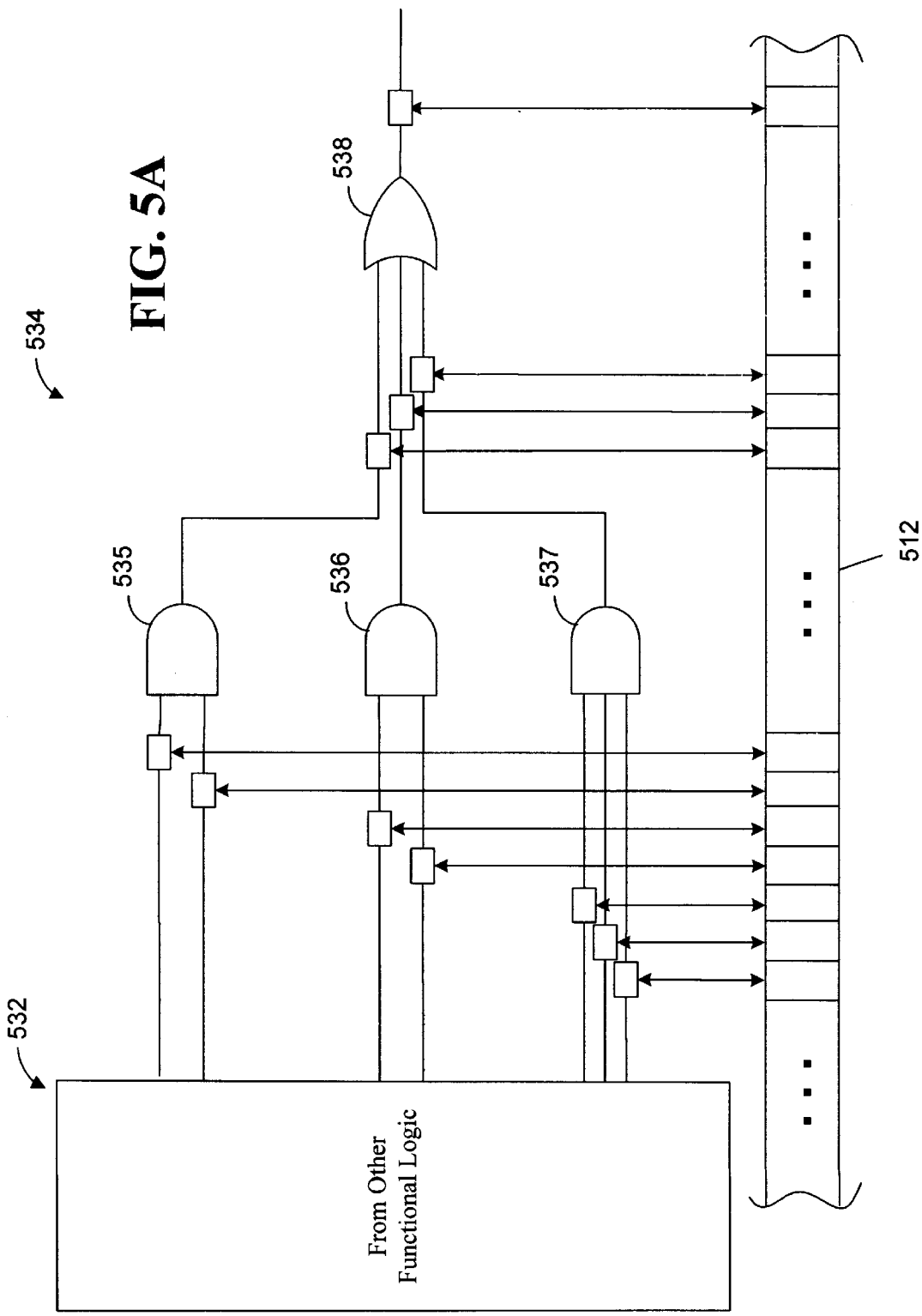
Figure 5C:
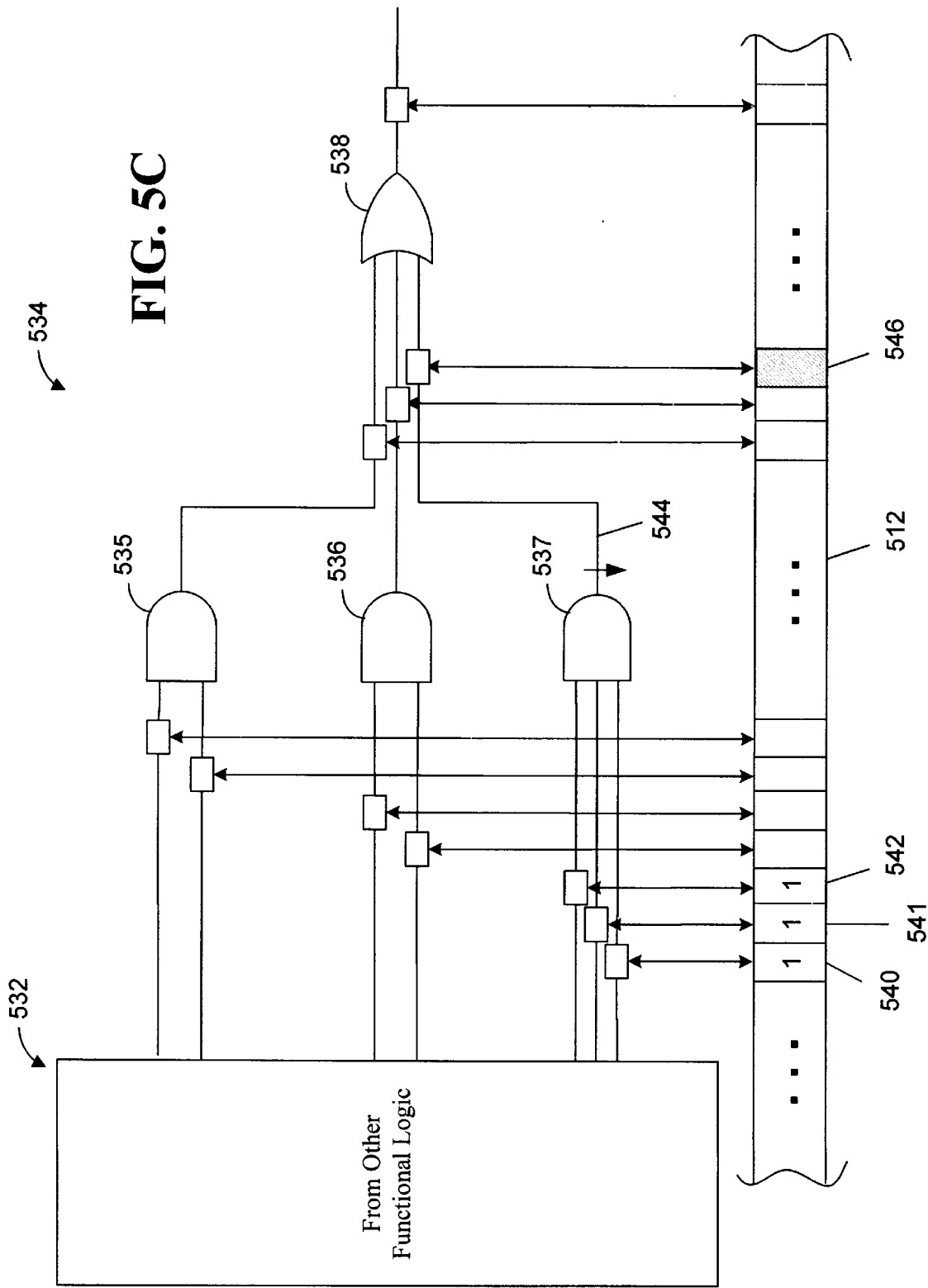

Returning now to the drawings, reference is made to FIGS. 5A through 5C to further illustrate the concept of testing and test vectors in a target environment of the preferred embodiment of the present invention. In this regard, FIG. 5A illustrates a layer segment of combinational logic 534, with other functional (sequential and combinational) logic 532. In the illustrated embodiment the segment of combinational logic 534 includes AND gates 535, 536 and 537, and an OR gate 538. A scan chain or scan register 512 is also illustrated as having bit values that are directly connected to signal lines of the various combinational logic circuit components. Although, as described in FIG. 4, the scan chain is preferably formed from sequential circuitry (such as D flip-flops), but has been illustrated in FIG. 5A in a different manner simply to facilitate the discussion herein. In the particular illustration of FIG. 5A, each input line and output line of the various combinational logic components is associated with a bit position (e.g., one flip-flop) in the scan chain 512.

Now referring to FIG. 5B, if the output of the AND gate 538 were to be tested for a "stuck at" "1" fault, at least one of the input lines must be set to "0". The two remaining input lines could be set to don't care values (e.g., "X"). In this regard, the three input bits 540, 541, and 542 may comprise the values "0XX" "X0X", or "XX0", as any of these three values would properly test the stuck at "1" fault condition on line 544. An output bit position 546 is associated with the signal line 544 in order to read and test the value output from AND gate 538. Thus, with the input of "0XX" as illustrated in FIG. 5B, the output of bit position 546 should be a 0, if the AND gate 538 is working properly. If, however, there is a stuck at "1" fault at the output of AND gate 538, the bit position of 546 would be a 1.

Reference is now made to FIG. 5C. In similar fashion, a stuck at "0" fault at the output of AND gate 538 may be tested by setting bit positions 540, 541, and 542 all to "1". The output bit position 546 may then be monitored to determined whether it is a "1" or "0" (in response to the "111" inputs). A "1" in the bit position 546 indicates proper operation of the AND gate 538. However, a "0" indicates a stuck at "0" fault on line 544.

In view of the foregoing discussion, it will be appreciated that similar faults may be tested for AND gates 535 and 536. Furthermore, it is readily verified that each of the fault conditions specified for the AND gates 535, 536, and 537 are mutually exclusive. That is, there is no overlap in either the input bits or the output bits of scan chain 512 for testing stuck at one faults for any of the three AND gates, or for testing stuck at zero faults for any of the AND gates. Thus, three separate test vectors that are generated, for example, for testing the three individual AND 535, 536, and 537 may be compacted into a single test vector. Advantageously, the result of such compaction reduces the memory requirement of the tester, and also speeds the testing process by allowing a single test vector to be shifted into the scan chain 512, as opposed to having to shift three separate test vectors into that scan chain; a process which obviously takes significantly more time to perform.

Having illustrated the principal concepts regarding testing using scan-type testing, reference is now made to FIGS. 6A through 6D, which illustrate the test set generation in accordance with the present invention. Specifically, the present invention is directed to a method and apparatus for generating a compacted set of test vectors for testing combinational logic within an integrated circuit chip. Unlike prior art systems, and those prevalent in the marketplace today, which utilize so-called dynamic compaction methods, the present invention utilizes a true dynamic compaction method. In this regard, test generators that are considered to perform dynamic compaction typically operate by defining a test vector that will test for a given fault. Then that test vector is expanded (by defining more bit positions) to test for an additional given fault. Then that expanded test vector is expanded again and again in this manner, until a fully utilized test vector is obtained. This process is referred to herein as "so-called" dynamic compaction, in that it is not really compacting two distinct vectors, but rather is operating to expand a given vector to detect additional fault(s). In contrast, a "true" dynamic compaction algorithm, operates to compact two distinct vectors into a single vector.

Although most test vectors will comprise hundreds, if not thousands, of bit positions, for simplification, a test vector of 14 bits is illustrated in FIGS. 6A through 6D. Assume, for purposes of illustration, a first vector is generated having the value "X101XXXXXX1XXX" (again, where "X" denotes a don't care bit position) and a second vector is generated having the value "XXX100XXXXXXXX". It is readily verified that these two vectors are readily compactable to produce a compacted test vector of "X10100XXXX1XXX". Now referring to 6B, assuming the compacted set of FIG. 6A now comprises a first vector, and assuming a second test vector of "XX00XXX1X01XXXX", it is readily verified that those two vectors are not compactable. Accordingly, the compacted test set will comprise the two vectors.

Figure 6D:
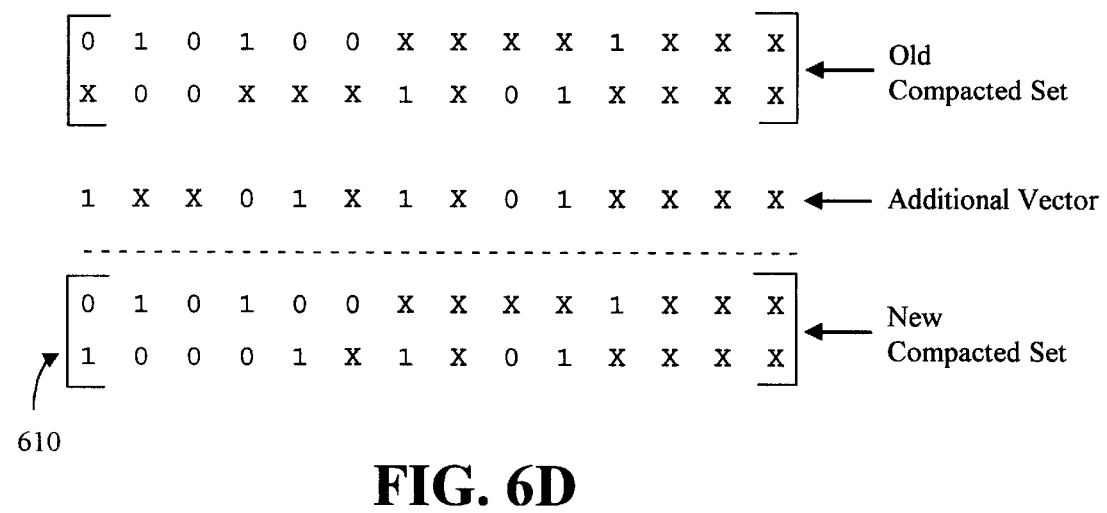

Referring now to FIG. 6C, and assuming as a starting point the compacted test set of FIG. 6B, an additional vector having a value "010XXXXXXXXXXX" is generated, it is seen that this additional vector may be compacted with the first vector of the old compacted set, thereby generating a new compacted set, as designated by reference numeral 610. Again, using this compacted set of two vectors as a starting point and generating an additional test vector of "1XX01X1X01XXXX" (FIG. 6D), the additional vector may not be compacted with the first vector of the compacted set, but is compactable with the second vector of the vector set, thereby generating a compacted set of test vectors 610. This process of generating additional test vectors and evaluating the existing set of compacted test vectors one by one to determine whether the additionally generated vectors may be compacted into any of the existing vectors may be repeated until all test vectors (corresponding to a list of faults to be tested) have been generated and compacted. The resulting set of test vectors provides a highly compact and efficient set of test vectors for testing a device.

Figure 7:
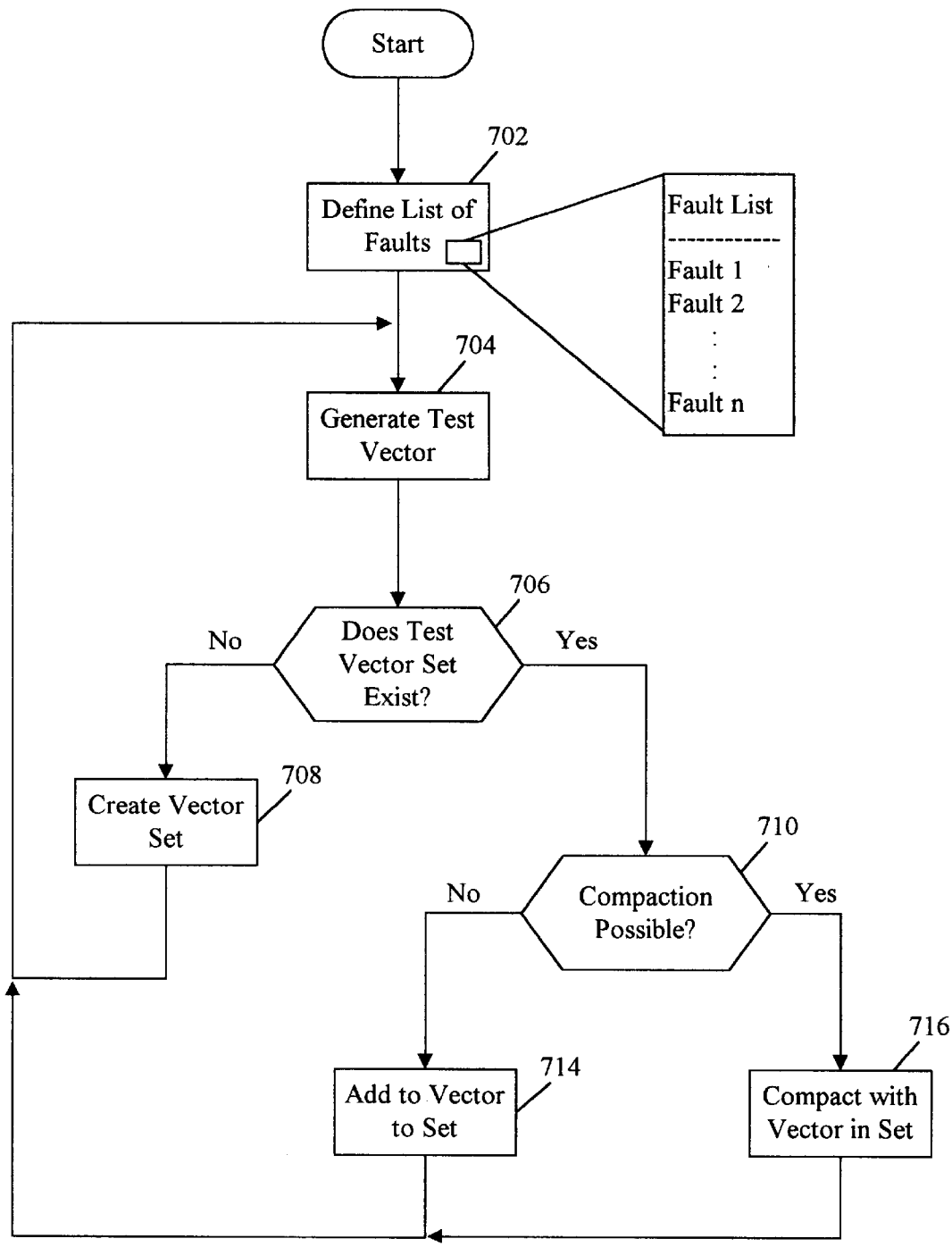
FIG. 7 is a flowchart illustrating the fundamental functional operation of a compaction method performed in accordance with the invention.

Reference is now made to FIG. 7 which illustrates the fundamental steps involved in the method of the preferred embodiment of the present invention. In this regard, the preferred embodiment first operates by defining a list of faults of an integrated circuit chip that are to be tested (step 702). This step need not be further discussed herein, as it will be appreciated that a given fault will be defined by the logic and chip layout of the particular integrated circuit to be tested. For each fault in the list of faults, a test vector is generated. Specifically, in the preferred embodiment test vectors are generated one at a time for each fault in the list of faults (step 704). Consistent with the scope and concepts of the invention, however, an alternative embodiment may generate a test vector that detects more than one fault in the list of faults.

At step 706, the preferred embodiment evaluates the test vector to determine whether a test vector set presently exists. If not, the preferred embodiment will create a set which will be defined simply as the test vector previously generated (step 708). If a test vector set presently exists, the preferred embodiment will then compare the newly generated test vector with each vector presently in the set to determine whether the newly generated test vector may be compacted with any vector in the test set (step 710). If not, the newly generated vector is added to the set of test vectors (step 714) and the system returns to step 704 where it generates the next test vector (corresponding to the next fault in the fault list). If compaction, however, is possible, then the newly-generated test vector is compacted with an existing vector of the test set at (step 716) and the system returns to step 704 where the next test vector is generated.

The process illustrated in FIG. 7 is repeated until a test vector is generated that corresponds to each fault in the list of faults. Accordingly, what is produced is a compacted set of test vectors that test every fault in a list of faults, in an efficient fashion.

In addition to the primary steps illustrated in FIG. 7, and in accordance with one embodiment of the present invention, it may be desired to periodically perform a fault simulation with a less-than-complete set of test vectors. If, for example, it is found that a given test vector not only adequately tests a defined fault, (i.e., the fault the test vector was configured to test) but also test one or more additional faults, then the list of faults may be reduced and therefore the number of test vectors generated may be correspondingly reduced. This may generate a compacted set of test vectors that is even more compact than that which would otherwise be generated by the present invention. In accordance with yet another embodiment of the present invention, once a compacted set of test vectors is generated, the invention may operate upon that compacted set by random filling each don't care bit value with a "1" or "0".

Specifically, arbitrary filling may be utilized to eliminate redundant vectors in the set. For example, don't care values of the first vector in the set may be random filled. This vector may then be again evaluated to determine whether it detects any additional faults, as a result of the random filled values. If so, the remaining vectors in the set may be evaluated. If any vector(s) remaining in the set test only for that additional fault(s) detected by the random filling, then that remaining vector(s) is redundant and may be removed from the set. Alternatively, all vectors may be arbitrarily filled (with 1s and 0s), then evaluated (as a group) to eliminate redundant vectors.

Figure 8A:
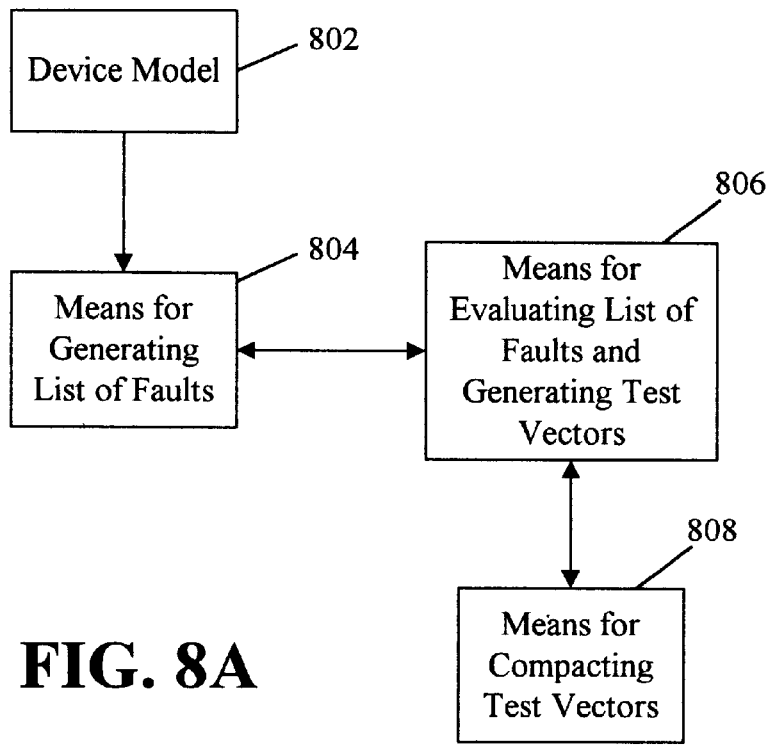
FIGS. 8A and 8B are block diagrams illustrating fundamental component of an apparatus for compacting a set of test vectors in accordance with the preferred embodiment of the invention.
Figure 8B:
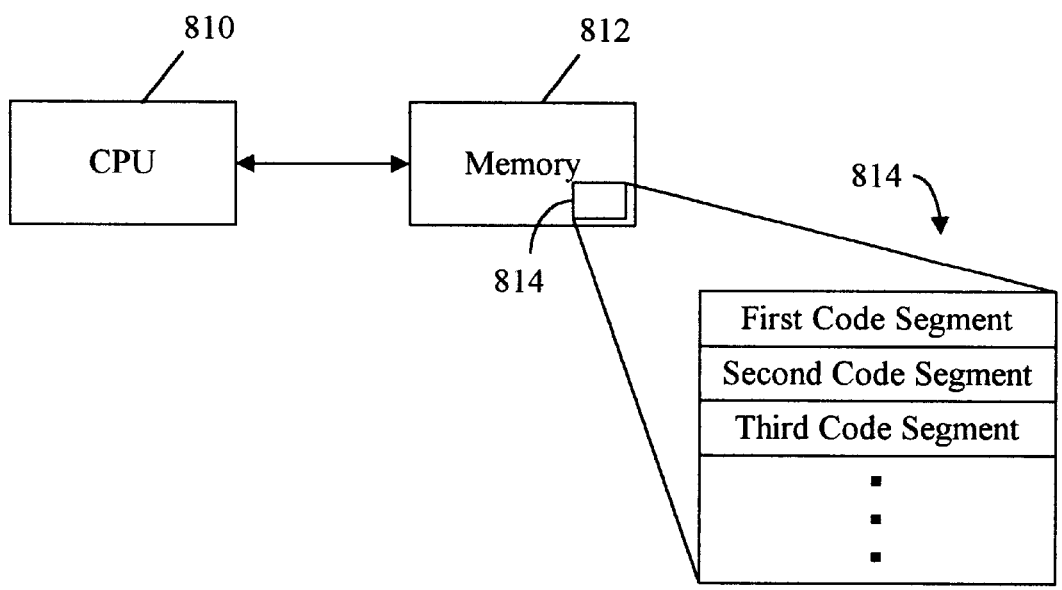

Reference is now made to FIGS. 8A and 8B, which illustrate a top-level diagram of an apparatus constructed in accordance with the preferred embodiment of the invention. In this regard, a device model 802 is a computer model that, as the name implies, models the operation of a device to be tested. A means for generating a list of faults 804, is provided in connection with the device model 802. This means may be implemented through software to evaluate the device model 802 and generate a list of faults to be tested. In communication with the means 804, means 806 is provided for evaluating the list of faults and generating test vectors for testing each fault in the list of faults. Finally, a means 808 is provided for compacting the list of test vectors generated by the means 806. Referring to FIG. 8B, the apparatus of FIG. 8A may be embodied in software. In this regard, a CPU 810 operates in conjunction with memory 812. A portion of memory 814 may comprise a plurality of code segments for implementing each of the components of FIG. 8A. For example, a first code segment may be provided for defining a list of faults of combinational logic in an integrated circuit chip. A second code segment may be provided for generating an uncompacted set of test vector, which may comprise one or more test vectors for testing faults in the list of faults. A third code segment may be provided for evaluating newly generated test vectors and compacting those newly generated vectors (on an individual basis) with test vectors presently existing in the set.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for generating a compacted set of test sequences for testing an integrated circuit having a scan register containing a plurality of bits defining test inputs for the integrated circuit, the method comprising the steps of:
   (a) defining a list of faults for the integrated circuit;
   (b) generating a first test sequence that defines values for those inputs necessary to detect a target fault selected from the list of faults;
   (c) adding the first test sequence to a list of test sequences and marking the selected fault as detected;
   (d) generating an additional test sequence which defines values for those inputs necessary to detect a target fault selected from the list of faults, and other than one marked as detected;
   (e) determining whether the additional test sequence may be compacted with any test sequence in the list of test sequences, and if so, compacting the additional test sequence with a test sequence in the set of test sequences, and if not, adding the additional test sequence to the set of test sequences; and
   (f) repeating steps (d) through (e) until a compacted condition is reached.

2. The method as defined in claim 1, wherein the first test defines values for those inputs necessary to detect a plurality of target faults selected from the list of faults.

3. The method as defined in claim 1, wherein the additional test defines values for those inputs necessary to detect a plurality of target faults selected from the list of faults.

4. The method as defined in claim 1, wherein the compacted condition is defined by a set of test vectors being created that completely tests the list of faults.

5. The method as defined in claim 1, wherein the compacted condition is defined by a set of test vectors being created that substantially tests the list of faults.

6. The method as defined in claim 1, wherein the additional test sequence of step (d) defines values for only those inputs necessary to detect a target fault selected from the list of faults.

7. The method as defined in claim 1, wherein the first test sequence of step (b) defines values for only those inputs necessary to detect a target fault selected from the list of faults.

8. The method as defined in claim 1, further including the step of fault simulating the first test sequence created in step (b) to determine if the first test sequence detects additional faults, and if so, marking said additional faults as detected.

9. The method as defined in claim 1, further including the step of fault simulating the additional test sequence created in step (d) and compacted in step (e) to determine if the additional test sequence detects additional faults, and if so, marking said additional faults as detected.

10. The method as defined in claim 1, further including the step of fault simulating the additional test sequence created in step (d) and not compacted in step (e) to determine if the additional test sequence detects additional faults, and if so, marking said additional faults as detected.

11. The method as defined in claim 1, further including the step of periodically removing redundant sequences.

12. The method as defined in claim 11, wherein the step of periodically removing redundant sequences includes arbitrarily filling don't care bit values and fault simulating those test sequences.

13. The method as defined in claim 1, further including the step of removing redundant sequences after the compacted condition has been reached.

14. The method as defined in claim 1, further including the step of arbitrarily filling unspecified inputs of sequences after all sequences have been generated and compacted.

15. The method as defined in claim 1, wherein the integrated circuit is a portion of a larger integrated circuit chip.

16. The method as defined in claim 1, further including the step of communicating the compacted set of test vectors to a testing device.

17. The method as defined in claim 1, wherein outputs for the test sequence are generated in response to the compacted condition.

18. A method for generating a compacted set of test sequences for testing combinational logic of an integrated circuit having a scan register containing a plurality of bits defining a test sequence, the method comprising the steps of:
   (a) defining a list of faults for the combinational logic of the integrated circuit;
   (b) generating a first test sequence for testing at least one fault in the list of faults and adding it to a set of test sequences;
   (c) generating an additional test sequence for testing at least one otherwise untested fault in the list of faults;
   (d) determining whether the additional test sequence may be compacted with any test sequence in the set of test sequences, and if so, compacting the additional test sequence with a test sequence in the set of test sequences, and if not, adding the additional test sequence to the set of test sequences; and
   (e) repeating steps (c) and (d) until a compacted condition is reached.

19. The method as defined in claim 18, wherein the compacted condition is defined a set of test sequences being created that substantially tests the list of faults.

20. The method as defined in claim 18, wherein the compacted condition is defined a set of test sequences being created that completely tests the list of faults.

21. The method as defined in claim 18, further including the step of sorting the list of faults.

22. The method as defined in claim 21, wherein the step of sorting operates to sort the list of faults in order from most difficult to least difficult.

23. The method as defined in claim 18, further including the step of arbitrarily filling any don't care values in the test sequences of the compacted set of test sequences.

24. An apparatus for generating a compacted set of test sequences comprising:

first means for evaluating a list of faults and generating a first test sequence configured to test at least one fault on the list of faults;

second means for evaluating the list of faults and generating a second test sequence configured to test at least one other untested fault on the list of faults;

third means for compacting the second test sequence with the first test sequence, if possible, the third means configured to add the second test sequence to a set of test sequences if compaction with the first test sequence is not possible;

fourth means for evaluating the list of faults and generating an additional test sequence configured to test at least one other untested fault on the list of faults; and fifth means for compacting the additional test sequence with one of the test sequences in the set of test sequences, if possible, the fifth means configured to add the additional test sequence to the set of test sequences if compaction with one of the test sequences is not possible.

25. The apparatus as defined in claim 24, further including sixth means for controlling the operation of the fourth and fifth means.

26. The apparatus as defined in claim 25, wherein the sixth means controls the fourth and fifth means for repeated operation until test sequences have been generated that test all possible faults on the list of faults.

27. The apparatus as defined in claim 25, wherein the sixth means controls the fourth and fifth means for repeated operation until test sequences have been generated that test substantially all possible faults on the list of faults.

28. The apparatus as defined in claim 25, further including seventh means for periodically simulating the set of test sequences before the set is complete.

29. The apparatus as defined in claim 24, wherein at least one of the first means, second means, third means, fourth means, and fifth means is implemented as a segment of executable code.

30. An apparatus for generating a compacted set of test sequences comprising:

first means for evaluating a list of faults and generating a first test sequence that defines values for those inputs necessary to detect a target fault selected from the list of faults and adding the first test sequence to a list of test sequences and marking the selected fault as detected;

second means for evaluating the list of faults and generating a second test sequence configured to test at another untested fault on the list of faults;

third means for compacting the second test sequence with the first test sequence, if possible, the third means configured to add the second test sequence to a set of test sequences if compaction with the first test sequence is not possible;

fourth means for evaluating the list of faults and generating an additional test sequence which defines values for those inputs necessary to detected a target fault selected from the list of faults, and other than one marked as detected; and fifth means for determining whether the additional test sequence may be compacted with any test sequence in the list of test sequences, and if so, compacting the additional test sequence with a test sequence in the set of test sequences, and if not, adding the additional test sequence to the set of test sequences.

31. A computer readable storage medium containing program code for generating a set of test sequences for testing combinational logic of an integrated circuit having a scan register containing a plurality of bits defining a test sequence, comprising:

a first code segment for defining a list of faults for the combinational logic of the integrated circuit;

a second code segment for generating an uncompacted set of test sequences comprising a plurality of test sequences, wherein each test sequence tests a fault in the list of faults;

a third code segment for evaluating a first test sequence in the uncompacted set of test sequences by individually compacting it with each of the remaining test sequences in the uncompacted set, until a compacted condition of the first test sequence is reached; and a forth code segment for repeating the evaluating step for each test sequence in the uncompacted set of test sequences.

* * * * *